US012227673B2

(12) United States Patent
Hung Low et al.

(10) Patent No.: US 12,227,673 B2
(45) Date of Patent: Feb. 18, 2025

(54) COMPOSITION AND METHOD FOR SILICON NITRIDE CMP

(71) Applicant: Cabot Microelectronics Corporation, Aurora, IL (US)

(72) Inventors: Fernando Hung Low, Aurora, IL (US); Steven Kraft, Plainfield, IL (US); Roman A. Ivanov, Aurora, IL (US)

(73) Assignee: CMC MATERIALS LLC, Aurora, IL (US)

(*) Notice: Subject to any disclaimer, the term of this patent is extended or adjusted under 35 U.S.C. 154(b) by 0 days.

(21) Appl. No.: 16/208,779

(22) Filed: Dec. 4, 2018

(65) Prior Publication Data

US 2020/0172761 A1    Jun. 4, 2020

(51) Int. Cl.
*C09G 1/02*         (2006.01)
*C09K 3/14*         (2006.01)
*H01L 21/3105*      (2006.01)

(52) U.S. Cl.
CPC .......... *C09G 1/02* (2013.01); *H01L 21/31055* (2013.01); *C09K 3/1409* (2013.01)

(58) Field of Classification Search
None
See application file for complete search history.

(56) References Cited

U.S. PATENT DOCUMENTS

| | | | |
|---|---|---|---|
| 5,196,353 A | 3/1993 | Sandhu | |
| 5,433,651 A | 7/1995 | Lustig | |
| 5,609,511 A | 3/1997 | Moriyama | |
| 5,643,046 A | 7/1997 | Katakabe | |
| 5,658,183 A | 8/1997 | Sandhu | |
| 5,730,642 A | 3/1998 | Sandhu | |
| 5,838,447 A | 11/1998 | Hiyama | |
| 5,872,633 A | 2/1999 | Holzapfel | |
| 5,893,796 A | 4/1999 | Birang | |
| 5,949,927 A | 9/1999 | Tang | |
| 5,964,643 A | 10/1999 | Birang | |
| 7,160,807 B2 | 1/2007 | De Rege Thesauro et al. | |
| 7,994,057 B2 | 8/2011 | Dysard | |
| 9,028,572 B2 | 5/2015 | Grumbine | |
| 9,382,450 B2 | 7/2016 | Belmont | |
| 9,422,456 B2 | 8/2016 | Grumbine | |
| 9,556,363 B2 | 1/2017 | Fu et al. | |
| 9,597,768 B1 | 3/2017 | Pandey et al. | |
| 10,037,889 B1 | 7/2018 | Kozhukh et al. | |
| 2009/0081871 A1* | 3/2009 | Dysard | C09G 1/02 438/693 |
| 2013/0244432 A1* | 9/2013 | Reiss | C09K 3/1463 438/693 |
| 2013/0244433 A1* | 9/2013 | Reiss | C09G 1/02 438/693 |
| 2015/0159046 A1 | 6/2015 | Dinega et al. | |

FOREIGN PATENT DOCUMENTS

| | | |
|---|---|---|
| JP | 2008519466 A | 6/2008 |
| JP | 2017057263 A | 3/2017 |
| WO | 2007067294 A2 | 6/2007 |
| WO | 2007127121 A1 | 11/2007 |
| WO | 2009042073 A2 | 4/2009 |

OTHER PUBLICATIONS

B. Burton et al, Epoxy formulations using Jeffamine polyetheramines, 2005, Huntsman, The Woorlands, TX.*
Korean Intellectual Property Office, International Search Report and Written Opinion of the International Searching Authority issued in connection with PCT/US2019/061261 on Mar. 10, 2020.

* cited by examiner

Primary Examiner — Stephanie P Duclair

(57) ABSTRACT

The invention provides a chemical-mechanical polishing composition for polishing a silicon nitride containing substrate. The composition includes an aqueous carrier; cationic silica particles dispersed in the aqueous carrier, the cationic silica abrasive particles having a zeta potential of at least 10 mV in the polishing composition; a polishing additive selected from the group consisting of a polyether amine, a polysilamine, a polyvinylimidazole, and a combination thereof, wherein the polyether amine and the polysilamine have corresponding weight average molecular weights of about 1,000 g/mol or less. The composition has a pH of greater than about 6. A method for polishing a silicon nitride containing substrate is also provided.

5 Claims, No Drawings

COMPOSITION AND METHOD FOR SILICON NITRIDE CMP

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

In the formation of a microelectronic transistor, a poly open polish process using at least two chemical-mechanical polishing (CMP) steps is useful. A hardmask such as silicon nitride is deposited on a substrate having a gate oxide layer and a polysilicon layer. An interlevel dielectric material, such as silicon dioxide, is deposited over the silicon nitride layer to cover the substrate. A first CMP process is used to remove a portion of the interlevel dielectric layer to preferably stop on the silicon nitride layer. A second CMP process is then used to remove the silicon nitride layer covering the polysilicon layer to expose the polysilicon. In order to achieve a highly planar surface, it is desirable to use a polishing composition having selectivity for silicon nitride over silicon oxide and polysilicon.

In another application, a microelectronic transistor comprises both a metal gate and a self-aligned contact structure. Typically, the metal gate is covered by a hardmask layer, such as silicon nitride, before the formation of the self-aligned contact structure to prevent etching of the metal gate during a process for forming the self-aligned contact structure. Excess silicon nitride is then removed from the surface using a CMP process. In order to efficiently achieve a highly planar surface, it is desirable to use a polishing composition having a high removal rate for silicon nitride that results in low defectivity.

Existing platforms that provide high selectivity of silicon nitride ("SiN") to silicon oxide are anionic silica or ceria based. For example, one general method for selective nitride polishing-stop on tetraethyl orthosilicate ("TEOS") application comprises cationic ceria particles at pH 7.0 and a cationic inhibitor, such as polyvinylimidazole. However, long term slurry stability issues, inconsistent selectivity performance due to small tool/process conditions variations, and ceria defect issues with the need of hydrogen fluoride for cleaning, makes existing platforms not the ideal solution for customers.

In addition, a number of existing polishing compositions, particularly containing ceria abrasives, exhibit a limited ability to be concentrated due to instability of the polishing compositions above a certain concentration, leading to settling out of abrasive components. The instability of concentrated polishing compositions thus requires production of more diluted polishing compositions, which increases the volume of material that must be shipped and stored.

Thus, there remains a need in the art for polishing compositions and methods that can provide desirable selectivity for silicon nitride and that have suitable removal rates, low defectivity, and suitable dishing performance, while further exhibiting enhanced dispersion stability.

BRIEF SUMMARY OF THE INVENTION

The invention provides a chemical-mechanical polishing composition for polishing a silicon nitride containing substrate. The composition includes an aqueous carrier, cationic silica abrasive particles dispersed in the aqueous carrier in which the cationic silica abrasive particles have a zeta potential of at least 10 mV in the polishing composition, and a polishing additive selected from the group consisting of a polyether amine, a polysilamine, a polyvinylimidazole, and a combination thereof, wherein the polyether amine and the polysilamine have corresponding weight average molecular weights of about 1,000 g/mol or less. The polishing composition has a pH of greater than about 6. A method for chemical mechanical polishing a substrate including silicon nitride is further disclosed. The method may include contacting the substrate with the above described polishing composition, moving the polishing composition relative to the substrate, and abrading the substrate to remove a portion of the silicon nitride layer from the substrate and thereby polish the substrate. In certain embodiments, the method may advantageously enable the removal rate of the silicon nitride layer to exceed four times the removal rate of a silicon oxide layer.

DETAILED DESCRIPTION OF THE INVENTION

A chemical-mechanical polishing composition is disclosed for polishing a silicon nitride containing substrate. The composition includes an aqueous carrier, cationic silica abrasive particles dispersed in the aqueous carrier in which the cationic silica abrasive particles have a zeta potential of at least 10 mV in the polishing composition, and a polishing additive selected from the group consisting of a polyether amine, a polysilamine, a polyvinylimidazole, and a combination thereof, wherein the polyether amine and the polysilamine have corresponding weight average molecular weights of about 1,000 g/mol or less. The polishing composition has a pH of greater than about 6. In certain embodiments the polyether amine and the polysilamine may have corresponding weight average molecular weights of less than about 600 g/mol.

The chemical-mechanical polishing composition comprises cationic silica abrasive particles, which desirably are suspended in the aqueous carrier (e.g., water). The cationic silica abrasive particles typically are in particulate form. Preferably, the cationic silica abrasive particles comprise, consist essentially of, or consist of silica particles, especially colloidal silica particles. Colloidal silica particles are prepared via a wet process and typically are non-aggregated, individually discrete particles, which generally are spherical or nearly spherical in shape, but can have other shapes (e.g., shapes with generally elliptical, square, or rectangular cross-sections). Such particles typically are structurally different from fumed particles, which are prepared via a pyrogenic or flame hydrolysis process and are chain-like structures of aggregated primary particles.

The particle size of a particle is the diameter of the smallest sphere that encompasses the particle. The cationic silica abrasive particles can have any suitable particle size. The cationic silica abrasive particles can have a mean (i.e., average) particle size of about 5 nm or more (e.g., about 10 nm or more, about 15 nm or more, about 20 nm or more, about 30 nm or more, about 40 nm or more, or about 50 nm or more). Alternatively, or in addition, the cationic silica abrasive particles can have a mean particle size of about 200 nm or less (e.g., about 180 nm or less, about 160 nm or less, about 150 nm or less, about 130 nm or less, about 80 nm or less, about 60 nm or less, or about 50 nm or less). Accordingly, the cationic silica abrasive particles can have a mean particle size within a range bounded by any two of the aforementioned endpoints. For example, the cationic silica abrasive particles can have a mean particle size of about 5 nm to about 200 nm (e.g., about 20 nm to about 180 nm, about 15 nm to about 150 nm, about 20 nm to about 80 nm, or about 20 nm to about 60 nm). In some embodiments, the cationic silica abrasive particles have a mean particle size of about 20 nm to about 80 nm. In certain embodiments, the cationic silica abrasive particles have a mean particle size of about 50 nm.

Any suitable amount of cationic silica abrasive particles can be present in the polishing composition. In some embodiments, the cationic silica abrasive particles can be present in the polishing composition at a concentration of about 0.0005 wt. % or more (e.g., about 0.001 wt. % or more, 0.0025 wt. % or more, about 0.005 wt. % or more, about 0.01 wt. % or more, about 0.025 wt. % or more, or about 0.05 wt. % or more). Typically, the cationic silica abrasive particles are present in the polishing composition at a concentration of about 0.0.025 wt. % or more (e.g., about 0.05 wt. % or more, about 0.1 wt. % or more, about 0.25 wt. % or more, about 0.5 wt. % or more, about 1 wt. % or more, or about 2 wt. % or more). Alternatively, or in addition, the cationic silica abrasive particles can be present in the polishing composition at a concentration of about 30 wt. % or less (e.g., about 25 wt. % or less, about 20 wt. % or less, about 15 wt. % or less, about 10 wt. % or less, about 5 wt. % or less, about 3 wt. % or less, or about 2 wt. % or less). Thus, the cationic silica abrasive particles can be present in the polishing composition at a concentration within a range bounded by any two of the aforementioned endpoints. For example, the cationic silica abrasive particles can be present in the polishing composition at a concentration of about 0.0005 wt. % to about 10 wt. % (e.g., about 0.001 wt. % to about 10 wt. %, about 0.005 wt. % to about 10 wt. %, about 0.01 wt. % to about 10 wt. %, about 0.05 wt. % to about 10 wt. %, about 0.1 wt. % to about 5 wt. %, about 0.1 wt. % to about 3 wt. %, about 0.1 wt. % to about 2 wt. %, or about 0.2 wt. % to about 2 wt. %). In certain embodiments, the cationic silica abrasive particles are present in the polishing composition at a concentration of about 0.025 wt. % to about 1 wt. %.

In certain embodiments, the cationic silica abrasive particles have a zeta potential of about 10 mV or more (e.g., about 15 mV or more, about 20 mV or more, about 25 mV or more, or about 30 mV or more) in the polishing composition (e.g., at a pH greater than about 6 or at a pH in a range from about 6 to about 8). The cationic silica abrasive particles may have a zeta potential of about 50 mV or less (e.g., about 45 mV or less or about 40 mV or less) in the polishing composition (e.g., at a pH greater than about 6 or at a pH in a range from about 6 to about 8). It will be understood that the cationic silica abrasive particles may have a zeta potential in a range bounded by any two of the aforementioned endpoints. For example, the cationic silica abrasive particles may have a zeta potential in a range from about 10 mV to about 50 mV (e.g., about 10 mV to about 45 mV, or about 20 mV to about 40 mV) in the polishing composition (e.g., at a pH greater than about 6 or at a pH in a range from about 6 to about 8).

In certain embodiments, the cationic silica abrasive particles may comprise colloidal silica particles treated with an aminosilane compound such that the treated abrasive particles have a zeta potential of about 10 mV or more (e.g., about 15 mV or more, about 20 mV or more, about 25 mV or more, or about 30 mV or more) in the polishing composition (e.g., at a pH greater than about 6, greater than about 7, greater than about 7.5, or greater than about 8). In certain of these embodiments, the abrasive particles comprise colloidal silica particles treated with a quaternary aminosilane compound. Such cationic colloidal silica particles may be obtained, for example, via treating the particles with at least one aminosilane compound as disclosed in commonly assigned U.S. Pat. Nos. 7,994,057 and 9,028,572 or in U.S. Pat. No. 9,382,450, each of which is incorporated by reference herein in its entirety. Colloidal silica particles having a zeta potential of about 10 mV or more in the polishing composition may also be obtained by incorporating a chemical species, such as an aminosilane compound, in the colloidal silica particles as disclosed in in commonly assigned U.S. Pat. No. 9,422,456, which is fully incorporated by reference herein.

It will be understood that that example cationic colloidal silica particles may be treated using any suitable treating method to obtain the cationic colloidal silica particles. For example, a quaternary aminosilane compound and the colloidal silica may be added simultaneously to some or all of the other components in the polishing composition. Alternatively, the colloidal silica may be treated with the quaternary aminosilane compound (e.g., via a heating a mixture of the colloidal silica and the aminosilane) prior to mixing with the other components of the polishing composition.

In some embodiments, the cationic silica abrasive particles have a surface which has been treated with at least one silane compound, aminosilane compound, phosphononium-silane compound, or sulfonium silane compound. In certain embodiments, the surface of the cationic silica abrasive particles has been treated with a primary aminosilane, secondary aminosilane, tertiary aminosilane, quaternary aminosilane, dipodal aminosilane, or combinations thereof. Suitable silane compounds include aminosilanes, such as aminopropyl trialkoxysilane, bis(2-hydroxyethyl)-3-aminopropyl trialkoxysilane, diethylaminomethyltrialkoxysilane, (N,N-diethyl-3-aminopropyl) trialkoxysilane, 3-(N-styrylmethyl)-2-aminoethylaminopropyl trialkoxysilane, 2-(N-benzylaminoethyl)-3-aminopropyl trialkoxysilane, trialkoxysilyl propyl-N,N,N-trimethyl ammonium chloride, N-(trialkoxysilylethyl)benzyl-N,N,N-trimethyl ammonium chloride, bis(methyldialkoxysilylpropyl)-N-methyl amine, bis(trialkoxysilylpropyl) urea, bis(3-(trialkoxysilyl)propyl)-ethylenediamine, and bis(trialkoxysilylpropyl)amine. The alkoxy groups in the above aminosilane compounds can be substituted by other hydrolyzable groups such as halides, amines and carboxylates. In certain embodiments, the cationic silica abrasive particles have a surface which has been treated with a quaternary aminosilane, dipodal aminosilane, or combinations thereof. The choice of silane compound depends, in part, on the type of substrate that is being polished.

Preferably, the surface treated cationic silica abrasive particles have a particle size which is the same as or larger than the particle size of the untreated cationic silica abrasive particles. More specifically, the surface treated cationic silica abrasive particles can have a particle size that is less than about 2 times larger than the particle size of the untreated cationic silica particles, less than about 1.7 times larger than the particle size of the untreated cationic silica particles, less than about 1.4 times larger than the particle size of the untreated cationic silica particles, or less than about 1.2 times larger than the particle size of the untreated cationic silica particles. The surface treated cationic silica abrasive particles preferably have a particle size that is about the same as the particle size of the untreated cationic silica abrasive particles. For example, the surface treated cationic silica abrasive particles can have a mean particle size of about 5 nm or more (e.g., about 10 nm or more, about 15 nm or more, about 20 nm or more, about 30 nm or more, about 40 nm or more, or about 50 nm or more). Alternatively, or in addition, the surface treated cationic silica abrasive particles can have a mean particle size of about 200 nm or less (e.g., about 180 nm or less, about 160 nm or less, about 150 nm or less, about 130 nm or less, about 80 nm or less, about 60 nm or less, or about 50 nm or less). Accordingly, the surface treated cationic silica abrasive particles can have a mean particle size within a range bounded by any two of the aforementioned endpoints. For example, the surface treated cationic silica particles can have a particle size of about 5 nm to about 200 nm (e.g., about 20 nm to about 180 nm, about 15 nm to about 150 nm, about 20 nm to about 80 nm, or about 20 nm to about 60 nm). In some embodiments, the surface treated cationic silica abrasive particles have a mean particle size of about 20 nm to about 80 nm. In preferred embodiments, the surface treated cationic silica abrasive particles have a mean particle size of about 50 nm.

Any suitable method of surface treating the cationic silica abrasive particles, many of which are known to those of ordinary skill in the art, can be used according to the invention. For example, the cationic silica abrasive particles can be treated with the aminosilane compound before mixing with the other components of the polishing composition, or the aminosilane and the cationic silica abrasive particles can be added simultaneously to some or all of the other components of the polishing composition.

It is preferred that the silane with which the cationic silica abrasive particle is treated does not cover all of the available silanol sites on the cationic silica abrasive particle. Typically, the surface treated cationic silica abrasive particles have a surface coverage of the available silanols of about 2% or more (e.g., about 4% or more, about 8% or more, or about 10% or more). The surface treated cationic silica abrasive particles preferably have a surface coverage of the available silanols of about 50% or less (e.g., about 30% or less, about 25% or less, about 20% or less, about 15% or less, or about 10% or less). Thus, the surface treated cationic silica abrasive particles can have a surface coverage of the available silanols within a range bounded by any two of the aforementioned endpoints. For example, the surface treated cationic silica abrasive particles can have a surface coverage of the available silanols of about 2% to about 50% (e.g., about 2% to about 30%, about 2% to about 20%, or about 4% to about 15%). The surface silanol concentration can be estimated using a typical value of 5 SiOH/nm$^2$ for the surface treated cationic silica abrasive particles and the BET surface area of the surface treated cationic silica abrasive particles The aminosilane compound can be present in the polishing composition in any suitable amount. In some embodiments, the polishing composition comprises about 30 ppm or more aminosilane compound (e.g., about 50 ppm or more, about 100 ppm or more, about 200 ppm or more, about 300 ppm or more, about 400 ppm or more, or about 500 ppm or more). Alternatively, or in addition, the polishing composition comprises about 2000 ppm or less aminosilane compound (e.g., about 1000 ppm or less, about 800 ppm or less, or about 600 ppm or less). Accordingly, the polishing composition can comprise about 30 ppm to about 2000 ppm aminosilane compound (e.g., about 100 ppm to about 1000 ppm, about 200 ppm to about 800 ppm, about 250 ppm to about 700 ppm, or about 275 ppm to about 600 ppm).

The zeta potential of a particle refers to the difference between the electrical charge of the ions surrounding the particle and the electrical charge of the bulk solution (e.g., the aqueous carrier and any other components dissolved therein). Accordingly, silica abrasive particles with a positive charge (i.e., cationic silica abrasive particles) will have a positive zeta potential at their operating pH. In some embodiments, the cationic silica abrasive particles and/or the surface treated cationic silica abrasive particles have a positive zeta potential at a pH of about 9.5 or less (e.g., about 9 or less, about 8 or less, about 7 or less, about 6 or less, about 5 or less, about 4 or less, or about 3 or less). In certain embodiments, the cationic silica abrasive particles and/or the surface treated cationic silica abrasive particles have a zeta potential of at least +10 mV at a pH of greater than about 6. Accordingly, the cationic silica abrasive particles and/or the surface treated cationic silica abrasive particles can have a zeta potential of about +10 mV or more (e.g., about +15 mV or more, about +20 mV or more, about +25 mV or more, or about +30 mV or more) at a pH of about 6 to about 8. Alternatively, or in addition, the cationic silica abrasive particles and/or the treated cationic silica abrasive particles can have a zeta potential of about +60 mV or less (e.g., about +55 mV or less, about +50 mV or less, about +45 mV or less, about +40 mV or less, or about +35 mV or less) at a pH of about 6 to about 8. Accordingly, the cationic silica abrasive particles and/or the surface treated cationic silica abrasive particles can have a zeta potential within a range bounded by any of the aforementioned endpoints. For example, the cationic silica abrasive particles and/or the surface treated cationic silica abrasive particles can have a zeta potential of about +10 mV to about +60 mV (e.g., about +10 mV to about +50 mV, about +15 mV to about +40 mV, or about +20 mV to about +40 mV) at a pH of about 6 to about 8.

In certain embodiments, the polishing composition may include a polishing additive for increasing the polishing selectivity of a silicon nitride layer to a silicon oxide layer. For example, the polishing additive may enable the removal rate of the silicon nitride layer to exceed the removal rate of a silicon oxide layer such that the silicon nitride to silicon oxide selectivity may be greater than about 1:1 (e.g., may be greater than about 2:1, or greater than about 4:1, or greater than about 10:1, or greater than about 20:1).

In some embodiments, the polishing additive may include a polyether amine, a polysilamine, a polyvinylimidazole, or combinations thereof. Typically, the polyether amine or polysilamine has a weight average molecular weight of less than about 1,000 g/mol, for example, about 900 g/mol or less, about 800 g/mol or less, about 700 g/mol or less, about 600 g/mol or less, or about 500 g/mol or less. Alternatively, or in addition, the polyether amine or polysilamine has a weight average molecular weight of about 50 g/mol or more, for example, about 75 g/mol or more, about 100 g/mol or more, about 150 g/mol or more, or about 200 g/mol or more. Thus, the polyether amine or polysilamine can have an average molecular weight bounded by any two of the aforementioned endpoints. For example, the polyether amine or polysilamine can have an average molecular weight of about 50 g/mol to about 900 g/mol, about 50 g/mol to about 800 g/mol, about 50 g/mol to about 700 g/mol, about 50 g/mol to about 600 g/mol, about 50 g/mol to about 500 g/mol, about 75 g/mol to about 900 g/mol, about 100 g/mol to about 900 g/mol, about 150 g/mol to about 900 g/mol, about 200 g/mol to about 900 g/mol, about 100 g/mol to about 800 g/mol, or about 100 g/mol to about 600 g/mol. In some embodiments, the polyether amine or polysilamine has a weight average molecular weight of about 800 g/mol or less. In certain embodiments, the polyether amine or polysilamine has a weight average molecular weight of about 600 g/mol or less.

In embodiments where the polishing additive comprises a polyether amine, the composition can comprise any suitable polyether amine. Typically, the polyether amine is selected from a propylene oxide diamine, a propylene oxide triamine, an ethylene oxide/propylene oxide diamine, an ethylene oxide/propylene oxide triamine, or combinations thereof. Illustrative polyetheramine compounds include the JEFFAMINE™ family of amines commercially available from Huntsman (The Woodlands, TX). The JEFFAMINE™ polyetheramines can comprise a polyether backbone based either on propylene oxide ("PO"), ethylene oxide ("EO"), or mixed EO/PO (e.g., O,O'-bis(2-aminopropyl) polypropylene glycol-block-polyethylene glycol-block-polypropylene glycol).

As used herein, the term "propylene oxide diamine" refers to a chemical structure comprising at least one propylene oxide subunit and two amine moieties. In some embodiments, the at least one propylene oxide subunit is a polypropylene oxide subunit.

As used herein, the term "propylene oxide triamine" refers to a chemical structure comprising at least one propylene oxide subunit and three amine moieties. In some embodiments, the at least one propylene oxide subunit is a polypropylene oxide subunit.

As used herein, the term "ethylene oxide/propylene oxide diamine" refers to a chemical structure comprising at least one ethylene oxide subunit, at least one propylene oxide subunit, and two amine moieties. In some embodiments, the at least one propylene oxide subunit is a polypropylene oxide subunit, the at least one ethylene oxide subunit is a polyethylene oxide subunit, or the at least one propylene oxide subunit is a polypropylene oxide subunit and the at least one ethylene oxide subunit is a polyethylene oxide subunit. Accordingly, the ethylene oxide/propylene oxide diamine can comprise block or random copolymers of ethylene oxide, propylene oxide, or combinations thereof.

As used herein, the term "ethylene oxide/propylene oxide triamine" refers to a chemical structure comprising at least one ethylene oxide subunit, at least one propylene oxide subunit, and three amine moieties. In some embodiments, the at least one propylene oxide subunit is a polypropylene oxide subunit, the at least one ethylene oxide subunit is a polyethylene oxide subunit, or the at least one propylene oxide subunit is a polypropylene oxide subunit and the at least one ethylene oxide subunit is a polyethylene oxide subunit. Accordingly, the ethylene oxide/propylene oxide triamine can comprise block or random copolymers of ethylene oxide, propylene oxide, or combinations thereof.

As used herein, the term "amine moiety" refers to a nitrogen-containing chemical moiety. The amine moiety can be substituted or unsubstituted. Accordingly, the amine moiety can be a primary, secondary, or tertiary amine. The reactivity of the polyetheramine and/or polysilamine can be modified by hindering the primary amine or through secondary amine functionality. Generally, the amine moiety is a primary amine substituent.

In some embodiments, the polyether amine is of Formula (I):

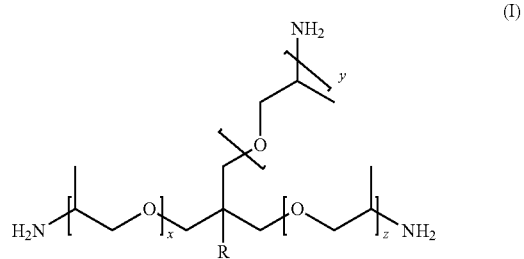

wherein R is a $C_1$-$C_6$ alkyl group (i.e., 1, 2, 3, 4, 5, or 6 carbon units in length) and x, y, and z independently are integers from 0 to 15 (e.g., 0, 1, 2, 3, 4, 5, 6, 7, 8, 9, 10, 11, 12, 13, 14, or 15). In certain embodiments, x, y, and z independently are integers from 0 to about 10. In some embodiments, x, y, and z refer to an average (rounded to the nearest integer) chain length of the designated subunits (i.e., average carbon chain length or average propylene oxide chain length). In some embodiments, the $C_1$-$C_6$ alkyl group is saturated, unsaturated, branched, straight-chained, cyclic, or combinations thereof. An exemplary list of $C_1$-$C_6$ alkyl groups is methyl, ethyl, n-propyl, iso-propyl, n-butyl, sec-butyl, tert-butyl, n-pentyl, sec-pentyl, neo-pentyl, or hexyl. In certain embodiments, the $C_1$-$C_6$ alkyl group is substituted with one or more alkyl substituents, aryl substituents, heteroatoms, or combinations thereof (e.g., benzyl, phenylethyl, phenylpropyl, etc.). In some embodiments, the $C_1$-$C_6$ alkyl group can be a $C_1$-$C_6$ heteroalkyl group (i.e., 1, 2, 3, 4, 5, or 6 carbon units in length). As used herein, "heteroalkyl group" refers to a saturated or unsaturated, substituted or unsubstituted, straight-chained, branched, or cyclic aliphatic group that contains at least 1 heteroatom (e.g., O, S, N, and/or P) in the core of the molecule (i.e., the carbon backbone).

In some embodiments, the polyether amine is of Formula (II):

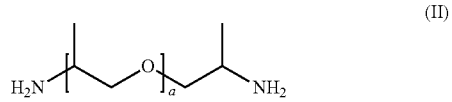

wherein a is an integer from 0 to 15 (e.g., 0, 1, 2, 3, 4, 5, 6, 7, 8, 9, 10, 11, 12, 13, 14, or 15). In certain embodiments, a is an integer from 0 to about 10. In some embodiments, a refers to an average (rounded to the nearest integer) chain length of the designated subunit (i.e., average carbon chain length or average polyethylene oxide chain length).

In some embodiments, the polyether amine is of Formula (III):

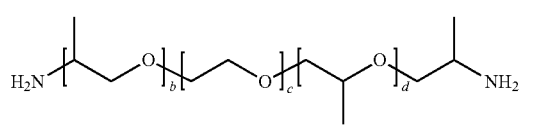

wherein b, c, and d independently are integers from 0 to 15 (e.g., 0, 1, 2, 3, 4, 5, 6, 7, 8, 9, 10, 11, 12, 13, 14, or 15). In certain embodiments, b, c, and d independently are integers from 0 to about 10. In some embodiments, b, c, and d refer to an average (rounded to the nearest integer) chain length of the designated subunits (i.e., average carbon chain length or average ethylene oxide/propylene oxide chain length).

In some embodiments, the polyether amine is of Formula (IV):

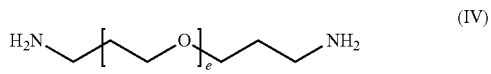

(IV)

wherein e is an integer from 0 to 15 (e.g., 0, 1, 2, 3, 4, 5, 6, 7, 8, 9, 10, 11, 12, 13, 14, or 15). In certain embodiments, e is an integer from 0 to about 10. In some embodiments, a refers to an average (rounded to the nearest integer) chain length of the designated subunit (i.e., average carbon chain length or average polyethylene oxide chain length).

In some embodiments, the polyether amine is JEFFAMINE™ D-230 (Formula II) having an approximate molecular weight of 230, JEFFAMINE™ D-400 (Formula II) having an approximate molecular weight of 400, JEFFAMINE™ T-403 (Formula I) having an approximate molecular weight of 400, JEFFAMINE™ ED-600 (Formula III) having an approximate molecular weight of 600, JEFFAMINE™ ED-900 (Formula III) having an approximate molecular weight of 900, 4,7,10-Trioxa-1,13-tridecanediamine (Formula IV), or combinations thereof.

In embodiments where the polishing additive comprises a polyether amine, the polishing composition can comprise any suitable amount of the polyether amine. For example, the polyether amine can be present in the polishing composition at a concentration of about 0.005 mM or more (e.g., about 0.01 mM or more, about 0.025 mM or more, about 0.05 mM or more, about 0.07 mM or more, or about 0.1 mM or more). Alternatively, or in addition, the polyether amine can be present in the polishing composition at a concentration of about 5 mM or less (e.g., about 4 mM or less, about 3 mM or less, about 2 mM or less, about 1 mM or less, about 0.5 mM or less, or about 0.25 mM or less). Accordingly, the polyether amine can be present in the polishing composition at a concentration within a range bounded by any two of the aforementioned endpoints. For example, the polyether amine can be present in the polishing composition at a concentration of about 0.005 mM to about 5 mM (e.g., about 0.01 mM to about 5 mM, about 0.025 mM to about 5 mM, about 0.05 mM to about 5 mM, about 0.1 mM to about 5 mM, about 0.25 mM to about 5 mM, about 0.005 mM to about 0.5 mM, about 0.01 mM to about 0.5 mM, about 0.025 mM to about 0.5 mM, about 0.05 mM to about 0.5 mM, or about 0.07 mM to about 0.25 mM).

In some embodiments, the polishing additive comprises a polysilamine. As used herein, the term "polysilamine" refers to a compound comprising a silicone subunit and at least one amine moiety. Illustrative polysilamine compounds include the SILAMINE™ family of polysilamines commercially available from Siltech Corporation (Toronto, Ontario). In certain embodiments, the polysilamine is SILAMINE™ A0 EDA, commercially available from Siltech Corporation.

In some embodiments, the polysilamine is of Formula (V):

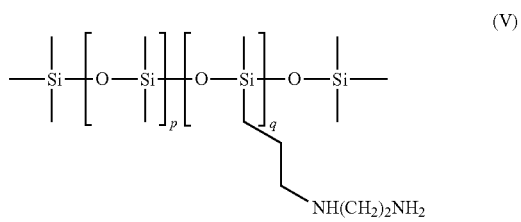

(V)

wherein p and q independently are integers from 0 to 15 (e.g., 0, 1, 2, 3, 4, 5, 6, 7, 8, 9, 10, 11, 12, 13, 14, or 15). In certain embodiments, p and q independently are integers from 0 to about 10. In some embodiments, p and q refer to an average (rounded to the nearest integer) chain length of the designated subunits (i.e., average silicon oxide chain length).

In embodiments where the polishing additive comprises a polysilamine, the polysilamine can be present in the polishing composition at any suitable concentration. For example, the polysilamine can be present in the polishing composition at a concentration of about 0.005 mM or more (e.g., about 0.01 mM or more, about 0.025 mM or more, about 0.05 mM or more, about 0.1 mM or more, or about 0.25 mM or more). Alternatively, or in addition, the polysilamine can be present in the polishing composition at a concentration of about 5 mM or less (e.g., about 4 mM or less, about 3 mM or less, about 2 mM or less, about 1 mM or less, or about 0.5 mM or less) polysilamine. Thus, the polysilamine can be present in the polishing composition at a concentration bounded by any two of the aforementioned endpoints. For example, the polysilamine can be present in the polishing composition at a concentration of about 0.005 mM to about 5 mM (e.g., about 0.01 mM to about 5 mM, about 0.025 mM to about 5 mM, about 0.05 mM to about 5 mM, about 0.1 mM to about 5 mM, about 0.25 mM to about 5 mM, about 0.005 mM to about 0.5 mM, about 0.01 mM to about 0.5 mM, about 0.025 mM to about 0.5 mM, or about 0.05 mM to about 0.5 mM).

In some embodiments, the polishing additive comprises a polyvinylimidazole. As used herein, the term "polyvinylimidazole" refers to one or more polymers selected from polyvinylimidazole, derivatives of polyvinylimidazole, copolymers of vinylimidazole and copolymers of vinylimidazole derivatives (collectively referred to as "PVI"). In certain embodiments, the polyvinylimidazole is poly-N-vinylimidazole. In some embodiments, copolymers of poly vinylimidazole contain a monomer selected from acrylate esters, acrylate amides, methacrylate esters, methacrylate amides, acrylonitrile, vinyl pyrrolidone, and vinyl chloride. In certain embodiments, the polyvinylimidazole is basotronic polyvinylimidazole.

In embodiments where the polishing additive comprises a polyvinylimidazole, the polyvinylimidazole can be present in the polishing composition at any suitable concentration. In some embodiments, the polyvinylimidazole can be present in the polishing composition at a concentration of about 0.005 mM or more (e.g., about 0.01 mM or more, about 0.025 mM or more, about 0.05 mM or more, about 0.1 mM or more, or about 0.25 mM or more). Alternatively, or in addition, the polyvinylimidazole can be present in the polishing composition at a concentration of about 5 mM or less (e.g., about 4 mM or less, about 3 mM or less, about 2 mM or less, about 1 mM or less, or about 0.5 mM or less). Thus, the polyvinylimidazole can be present in the polishing composition at a concentration bounded by any two of the aforementioned endpoints. For example, the polyvinylimidazole can be present in the polishing composition at a concentration of about 0.005 mM to about 5 mM (e.g., about 0.01 mM to about 5 mM, about 0.025 mM to about 5 mM, about 0.05 mM to about 5 mM, about 0.1 mM to about 5 mM, about 0.25 mM to about 5 mM, about 0.005 mM to about 0.5 mM, about 0.01 mM to about 0.5 mM, about 0.025 mM to about 0.5 mM, or about 0.05 mM to about 0.5 mM) polyvinylimidazole.

Generally, the chemical-mechanical polishing composition has a pH of greater than about 6 (e.g., greater than about 6.5, greater than about 7, greater than about 7.5, greater than about 8, greater than about 8.5, or greater than about 9), when measured at 1 atm and 25° C. In some embodiments, the polishing composition has a pH of about 6 to about 12, for example, about 6 to about 11, about 6 to about 10, about 6 to about 9, about 6 to about 8, about 7 to about 12, about 7 to about 11, about 7 to about 10, about 7 to about 9, or about 7 to about 8. In certain embodiments, the polishing composition has a pH of about 6 to about 8 (e.g., about 7).

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition.

The compound capable of adjusting the pH can be selected from ammonium salts, alkali metal salts, carboxylic acids, alkali metal hydroxides, alkali metal carbonates, alkali metal bicarbonates, borates, organic acids (e.g., acetic acid), organic bases (e.g., amines), and mixtures thereof.

The chemical-mechanical polishing composition optionally further comprises one or more chemical agents. Illustrative chemical agents include buffers, conditioners, biocides, scale inhibitors, dispersants, etc. In some embodiments, the chemical-mechanical composition further comprises a buffer and a biocide.

In some embodiments, the chemical-mechanical polishing composition further comprises a buffer. As used herein, the term "buffer" refers to any chemical capable of achieving and/or maintaining the pH of the polishing composition. For example, the buffer can be an acidic chemical, a basic chemical, a neutral chemical, or combinations thereof. An exemplary list of buffers includes nitric acid, sulfuric acid, phosphoric acid, phthalic acid, citric acid, adipic acid, oxalic acid, malonic acid, maleic acid, ammonium hydroxide, phosphates, sulfates, acetates, malonates, oxalates, borates, ammonium salts, amines, polyols (e.g., trisbase), amino acids, and the like.

In some embodiments, the chemical-mechanical composition comprises a biocide. When present, the biocide can be any suitable biocide and can be present in the polishing composition in any suitable amount. An exemplary biocide is an isothiazolinone biocide. The amount of biocide in the polishing composition typically is about 1 ppm to about 200 ppm (e.g., about 10 ppm to about 200 ppm, about 10 ppm to about 150 ppm, about 20 ppm to about 150 ppm, about 50 ppm to about 150 ppm, about 1 ppm to about 150 ppm, or about 1 ppm to about 100 ppm).

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., cationic silica abrasive particles, optional silane compounds, polyether amines, polysilamines, optional buffers, optional conditioners, optional biocides, optional scale inhibitors, optional dispersants, polyvinylimidazoles, etc.) as well as any combination of ingredients (e.g., cationic silica abrasive particles, optional silane compounds, polyether amines, polysilamines, optional buffers, optional conditioners, optional biocides, optional scale inhibitors, optional dispersants, polyvinylimidazoles, etc.).

For example, the polishing composition can be prepared by (i) providing all or a portion of the aqueous carrier, (ii) dispersing the cationic silica abrasive particles and/or treated cationic silica abrasive particles, polyether amine and/or polysilamine, and any optional chemical agent, using any suitable means for preparing such a dispersion, (iii) adjusting the pH of the dispersion as appropriate, and (iv) optionally adding suitable amounts of any other optional components and/or chemical agents to the mixture.

In some embodiments, the chemical-mechanical composition is stored in a single container. In other embodiments, the chemical-mechanical composition is stored in two or more containers, such that the chemical-mechanical composition is mixed at or near the point-of-use. In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the cationic silica abrasive particles and/or the surface treated cationic silica abrasive particles, polyether amine and/or polysilamine, and any optional chemical agent can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the polyether amine and/or polysilamine, and any optional chemical agent are at least partially or fully dissolved in the concentrate. Desirably, the inventive polishing composition is colloidally stable when in the form of a concentrate that is 4 times more concentrated than the polishing composition at the point-of-use.

The invention also provides a method of chemically-mechanically polishing a substrate comprising: (i) providing a substrate comprising a silicon nitride (SiN) layer on a surface of the substrate; (ii) providing a polishing pad; (iii) providing a chemical-mechanical polishing composition comprising: (a) cationic silica abrasive particles, (b) a polyether amine, a polysilamine, or combinations thereof, and (c) an aqueous carrier; wherein the polyether amine or polysilamine has a weight average molecular weight of less than about 1,000 g/mol, the polishing composition has a pH of greater than about 6, and the cationic silica abrasive particles have a zeta potential of at least +10 mV at a pH of greater than about 6; (iv) contacting the substrate with the polishing pad and the chemical-mechanical polishing composition; and (v) moving the polishing pad and the chemical-mechanical polishing composition relative to the substrate to abrade at least a portion of the SiN layer on a surface of the substrate to polish the substrate.

The invention further provides a method of chemically-mechanically polishing a substrate comprising: (i) providing a substrate comprising a silicon nitride (SiN) layer on a surface of the substrate; (ii) providing a polishing pad; (iii) providing a chemical-mechanical polishing composition comprising: (a) cationic silica abrasive particles, (b) a polyvinylimidazole derivative, and (c) an aqueous carrier; wherein the polishing composition has a pH of greater than about 6, and the cationic silica abrasive particles have a zeta potential of at least +10 mV at a pH of greater than about 6; (iv) contacting the substrate with the polishing pad and the chemical-mechanical polishing composition; and (v) moving the polishing pad and the chemical-mechanical polishing composition relative to the substrate to abrade at least a portion of the SiN layer on a surface of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or all three of the aforementioned materials, and especially useful for polishing substrates comprising silicon nitride.

In certain embodiments, the substrate comprises polysilicon in combination with silicon oxide and/or silicon nitride. The polysilicon can be any suitable polysilicon, many of which are known in the art. The polysilicon can have any suitable phase and can be amorphous, crystalline, or combinations thereof. The silicon oxide similarly can be any suitable silicon oxide, many of which are known in the art. Suitable types of silicon oxide include, but are not limited to, borophosphosilicate glass (BPSG), PETEOS, thermal oxide, undoped silicate glass, and HDP oxide.

The chemical-mechanical polishing composition of the invention desirably exhibits a high removal rate when polishing a substrate comprising silicon nitride according to a method of the invention. For example, when polishing silicon wafers comprising silicon nitride in accordance with an embodiment of the invention, the polishing composition desirably exhibits a silicon nitride removal rate of about 500 Å/min or higher, 700 Å/min or higher, about 1,000 Å/min or higher, about 1,250 Å/min or higher, about 1,500 Å/min or higher, about 1,750 Å/min or higher, or about 2,000 Å/min or higher.

The chemical-mechanical polishing composition of the invention desirably exhibits a low removal rate when polishing a substrate comprising silicon oxide according to a method of the invention. For example, when polishing silicon wafers comprising silicon oxide in accordance with an embodiment of the invention, such as high density plasma (HDP) oxides and/or plasma-enhanced tetraethyl orthosilicate (PETEOS) and/or tetraethyl orthosilicate (TEOS), the polishing composition desirably exhibits a removal rate of the silicon oxide of about 800 Å/min or lower, for example, about 700 Å/min or lower, about 600 Å/min or lower, about 500 Å/min or lower, about 400 Å/min or lower, about 200 Å/min or lower, about 100 Å/min or lower, about 75 Å/min or lower, about 50 Å/min or lower, or even about 25 Å/min or lower.

The chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, about 750 Å/min or lower, about 500 Å/min or lower, about 250 Å/min or lower, about 100 Å/min or lower, about 50 Å/min or lower, about 25 Å/min or lower, about 10 Å/min or lower, or even about 5 Å/min or lower.

In certain embodiments, the substrate comprises a silicon nitride (SiN) layer and a silicon oxide (SiO) layer on the surface of the substrate. In some embodiments, the abrasion of the silicon nitride layer provides a silicon nitride removal rate and the abrasion of the silicon oxide layer provides a silicon oxide removal rate, wherein the ratio of the silicon nitride removal rate to the silicon oxide removal rate is greater than about 4 to 1. Accordingly, the chemical-mechanical polishing composition of the invention can be used to polish a substrate with a silicon nitride to silicon oxide polishing selectivity of about 4:1 or higher (e.g., about 5:1 or higher, about 6:1 or higher, about 7:1 or higher, about 8:1 or higher, about 9:1 or higher, about 10:1 or higher, about 15:1 or higher, about 20:1 or higher, or about 40:1 or higher). In certain embodiments, the ratio of the silicon nitride removal rate to the silicon oxide removal rate is greater than about 20 to 1. The chemical-mechanical polishing composition of the invention can be tailored to provide effective polishing at the desired polishing ranges selective to specific thin layer materials, while at the same time minimizing surface imperfections, defects, corrosion, erosion, and the removal of stop layers. The selectivity can be controlled, to some extent, by altering the relative concentrations of the components of the polishing composition.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. Particularly preferred polishing pads are the EPIC™ D100 pad and NEXPLANAR™ E6088 pad commercially available from Cabot Microelectronics and the IC1010™ pad commercially available from Dow Chemical Company.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The invention is further illustrated by the following embodiments.

Embodiment (1) is a chemical-mechanical polishing composition for polishing a silicon nitride containing substrate. The composition comprises an aqueous carrier; cationic silica particles dispersed in the aqueous carrier, the cationic silica abrasive particles having a zeta potential of at least 10 mV in the polishing composition; a polishing additive selected from the group consisting of a polyether amine, a polysilamine, a polyvinylimidazole, and a combination thereof, wherein the polyether amine and the polysilamine have corresponding weight average molecular weights of less than about 1,000 g/mol; and wherein the polishing composition has a pH of greater than about 6.

Embodiment (2) is a polishing composition according to embodiment (1) wherein the polishing additive comprises polyvinylimidazole.

Embodiment (3) is a polishing composition according to embodiment (1) wherein the polishing additive comprises polysilamine having a weight average molecular weight of about 900 g/mol or less.

Embodiment (4) is a polishing composition according to embodiment (1) wherein the polishing additive comprises polyether amine having a weight average molecular weight of about 900 g/mol or less.

Embodiment (5) is a polishing composition according to embodiment (4) wherein the polyether amine is a propylene oxide diamine, a propylene oxide triamine, an ethylene oxide/propylene oxide diamine, an ethylene oxide/propylene oxide triamine, or a combination thereof.

Embodiment (6) is a polishing composition according to embodiment (5) wherein the polyether amine is of Formula (I):

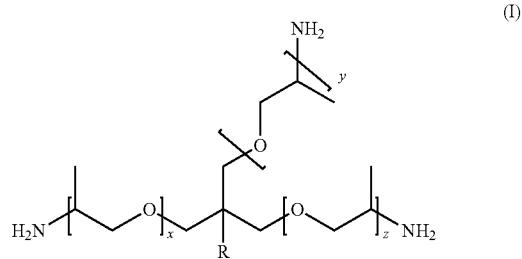

wherein R is a $C_1$-$C_6$ alkyl group and x, y, and z independently are integers from 0 to 15.

Embodiment (7) is a polishing composition according to any one of embodiments (1) and (3)-(6) wherein the polishing additive comprises a polyether amine having a weight average molecular weight of about 600 g/mol or less or a polysilamine having a weight average molecular weight of about 600 g/mol or less.

Embodiment (8) is a polishing composition according to any one of embodiments (1)-(7) wherein the polishing additive is present in the polishing composition at a concentration in a range from about 0.01 mM to about 1 mM.

Embodiment (9) is a polishing composition according to any one of embodiments (1)-(8) wherein the cationic silica abrasive particles have a surface which has been treated with a quaternary aminosilane, dipodal aminosilane, or combinations thereof.

Embodiment (10) is a polishing composition according to any one of embodiments (1)-(9) wherein the cationic silica abrasive particles comprise colloidal silica particles having a permanent positive charge of at least 20 mV at a pH of greater than about 6.

Embodiment (11) is a the polishing composition according to any one of embodiments (1)-(7) wherein the cationic silica abrasive particles have a mean particle size of about 20 nm to about 80 nm.

Embodiment (12) is a polishing composition according to any one of embodiments (1)-(11) wherein the polishing composition has a pH of about 6 to about 8.

Embodiment (13) is a polishing composition according to any one of embodiments (1)-(12) wherein the polishing composition has a pH of about 7.

Embodiment (14) is a method of chemically-mechanically polishing a substrate. The method includes (a) providing a substrate comprising a silicon nitride (SiN) layer on a surface of the substrate; (b) providing a polishing pad; (c) providing a chemical-mechanical polishing composition comprising: (i) an aqueous carrier; (ii) cationic silica particles dispersed in the aqueous carrier, the cationic silica abrasive particles having a zeta potential of at least 10 mV in the polishing composition; (iii) an polishing additive selected from the group consisting of a polyether amine, a polysilamine, a polyvinylimidazole, and a combination thereof, wherein the polyether amine and the polysilamine have corresponding weight average molecular weights of about 1,000 g/mol or less; and wherein the polishing composition has a pH of greater than about 6; (d) contacting the substrate with the polishing pad and the chemical-mechanical polishing composition; and (e) moving the polishing pad and the chemical-mechanical polishing composition relative to the substrate to abrade at least a portion of the SiN layer on a surface of the substrate to polish the substrate.

Embodiment (15) is a method according to embodiment (14) wherein the polishing additive comprises polyvinylimidazole.

Embodiment (16) is a method according to embodiment (14) wherein the polishing additive comprises polysilamine having a weight average molecular weight of about 1,000 g/mol or less.

Embodiment (17) is a method according to embodiment (14) wherein the polishing additive comprises polyether amine having a weight average molecular weight of about 1,000 g/mol or less.

Embodiment (18) is a method according to embodiment (17) wherein the polyether amine is a propylene oxide diamine, a propylene oxide triamine, an ethylene oxide/propylene oxide diamine, an ethylene oxide/propylene oxide triamine, or a combination thereof.

Embodiment (19) is a method according to embodiment (18) wherein the polyether amine is of Formula (I):

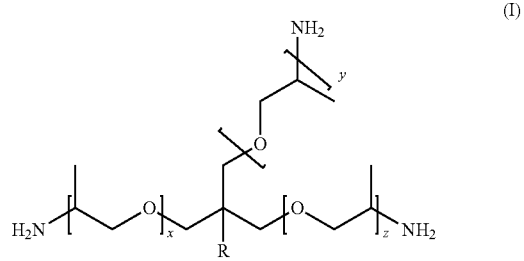

wherein R is a $C_1$-$C_6$ alkyl group and x, y, and z independently are integers from 0 to 15.

Embodiment (20) is a method according to any one of embodiments (14) and (16)-(19) wherein the polishing additive comprises a polyether amine having a weight average molecular weight of about 600 g/mol or less or a polysilamine having a weight average molecular weight of about 600 g/mol or less.

Embodiment (21) is a method according to any one of embodiments (14)-(20) wherein the polishing additive is present in the polishing composition at a concentration in a range from about 0.01 mM to about 1 mM.

Embodiment (22) is a method according to any one of embodiments (14)-(21) wherein the cationic silica abrasive particles have a surface which has been treated with a quaternary aminosilane, dipodal aminosilane, or combinations thereof.

Embodiment (23) is a method according to any one of embodiments (14)-(22) wherein the cationic silica abrasive particles comprise colloidal silica particles having a permanent positive charge of at least 20 mV at a pH of greater than about 6.

Embodiment (24) is a method according to any one of embodiments (14)-(23) wherein the cationic silica abrasive particles have a mean particle size of about 20 nm to about 80 nm.

Embodiment (25) is a method according to any one of embodiments (14)-(24) wherein the polishing composition has a pH of about 6 to about 8.

Embodiment (26) is a method according to any one of embodiments (14)-(25) wherein: (i) the substrate further comprises a silicon oxide (SiO) layer on a surface of the substrate; (ii) at least a portion of the silicon oxide layer is abraded to polish the substrate; and (iii) the abrasion of the SiN layer provides a SiN removal rate and the abrasion of the SiO layer provides a SiO removal rate such that a ratio of the SiN removal rate to the SiO removal rate is greater than about 4 to 1.

EXAMPLES

These following examples further illustrate the invention but, of course, should not be construed as in any way limiting its scope.

The following abbreviations are used throughout the Examples: removal rate (RR); tetraethyl orthosilicate (TEOS); and silicon nitride (SiN).

In the following examples, substrates, TEOS silicon oxide (prepared from tetraethoxysilane) coated on silicon, SiN coated on silicon, and patterned wafers obtained from Silyb Inc. were polished using a Logitech 2 benchtop polishing machine at 1.5 PSI (10.3 kPa) downforce. The patterned wafers comprised 100 μm silicon nitride features on silicon oxide-coated substrates. A Nexplanar E6088 pad with Saesol C7 (commercially available from Saesol Diamond incl. Co., Ltd., South Korea) conditioner was used with identical polishing parameters for all compositions. Standard Logitech polishing parameters were as follows: Nexplanar E6088 pad, downforce=10.3 kPa (1.5 psi), head speed=87 rpm, platen speed=93 rpm, total flow rate=50 mL/min. Removal rates were calculated by measuring the film thickness, using spectroscopic ellipsometry, and subtracting the final thickness from the initial thickness.

Example 1

This example demonstrates the effect of additive type and molecular weight on SiN:TEOS selectivity as measured by silicon nitride removal rate versus silicon oxide removal rate.

Substrates comprising TEOS-coated silicon and silicon nitride-coated silicon were polished with sixteen (16) different polishing compositions, Polishing Compositions 1A-1P (Table 1). The substrates were polished on a Logitech 2 benchtop polishing machine at 1.5 PSI (10.3 kPa) downforce using a Nexplanar E6088 pad with Saesol C7 conditioner. Each of the polishing compositions contained 0.5 wt. % cationic silica abrasive particles, 2 mM TRIS hydrochloride, and 120 ppm biocide at a pH of 7. The cationic colloidal silica particles were prepared as described in Example 7 of U.S. Pat. No. 9,382,450. Each of the polishing compositions further contained a polishing additive in the amount shown in Table 1.

Following polishing, the removal rates for TEOS and SiN were determined. The results are set forth in Table 1.

As is apparent from the results set forth in Table 1, Polishing Compositions 1H-1P, which contained a polishing additive with a molecular weight of less than about 1,000 g/mol, exhibited the highest SiN:TEOS selectivity. Polishing Composition 1N, which contained JEFFAMINE™ T-403, exhibited almost 50 times the selectivity of the control with a SiN:TEOS selectivity at a ratio of 48:1.

Example 2

This example demonstrates the effect of additive concentration on SiN:TEOS selectivity as measured by silicon nitride removal rate versus silicon oxide removal rate.

Substrates comprising TEOS-coated silicon and silicon nitride-coated silicon were polished with five (5) different polishing compositions, Polishing Compositions 2A-2E (Table 2). The substrates were polished on a Logitech 2 benchtop polishing machine at 1.5 PSI (10.3 kPa) downforce using a Nexplanar E6088 pad with Saesol C7 conditioner. Each of the polishing compositions contained 0.5 wt. % cationic silica abrasive particles, 2 mM TRIS hydrochloride, and 120 ppm biocide at a pH of 7. Each of Polishing Compositions 2B-2E further contained JEFFAMINE™ T-403 in amounts as shown in Table 2. Polishing Composition 2A is provided as a control. The cationic colloidal silica particles were prepared as described in Example 7 of U.S. Pat. No. 9,382,450.

Following polishing, the removal rates for TEOS and SiN were determined. The results are set forth in Table 2.

TABLE 1

SiN:TEOS Polishing Selectivity as a Function of Polishing Composition Additive

| Polishing Composition | Polishing Additive | Additive Molecular Weight (g/mol) | Additive Concentration (mM) | Polishing Selectivity (SiN:TEOS) |
| --- | --- | --- | --- | --- |
| 1A (Control) | None | — | — | 1.6 |
| 1B (Comparative) | ethylenediamine | 60 | 1 | 1 |
| 1C (Comparative) | polyDADMAC (diallyldimethyl ammonium chloride) | 8,500 | 0.033 | 1 |
| 1D (Comparative) | Luviquat ® Supreme AT | 300,000 | 0.0001 | 1 |
| 1E (Comparative) | SILAMINE ™ AS | 3,000 | 0.033 | 2 |
| 1F (Comparative) | JEFFAMINE ™ T-3,000 | 3,000 | 0.033 | 1 |
| 1G (Comparative) | JEFFAMINE ™ M-1,000 | 1,000 | 0.033 | 1 |
| 1H (Inventive) | basotronic polyvinylimidazole | — | 0.011 | 4 |
| 1I (Inventive) | polyvinylimidazole | 282 | 0.017 | 6 |
| 1J (Inventive) | 4,7,10-trioxa-1,13-tridecanediamine | 220 | 1 | 3 |
| 1K (Inventive) | SILAMINE ™ A0 EDA | 400 | 0.100 | 8 |
| 1L (Inventive) | JEFFAMINE ™ D-230 | 230 | 0.133 | 5 |
| 1M (Inventive) | JEFFAMINE ™ D-400 | 400 | 0.066 | 4 |
| 1N (Inventive) | JEFFAMINE ™ T-403 | 403 | 0.066 | 48 |
| 1O (Inventive) | JEFFAMINE ™ ED-600 | 600 | 0.066 | 4 |
| 1P (Inventive) | JEFFAMINE ™ ED-900 | 900 | 0.066 | 2 |

TABLE 2

SiN and TEOS Removal Rates as a Function of Additive Concentration

| Polishing Composition | Polishing Additive | Additive Concentration (mM) | TEOS RR (Å/min) | SiN RR (Å/min) | Polishing Selectivity (SiN:TEOS) |
|---|---|---|---|---|---|
| 2A (Control) | None | — | 431 | 536 | 12 |
| 2B (Inventive) | JEFFAMINE™ T-403 | 0.07 | 201 | 500 | 2.5 |
| 2C (Inventive) | JEFFAMINE™ T-403 | 0.1 | 8 | 383 | 48 |
| 2D (Inventive) | JEFFAMINE™ T-403 | 0.13 | 22 | 383 | 17 |
| 2E (Inventive) | JEFFAMINE™ T-403 | 0.27 | 58 | 195 | 3.4 |

As is apparent from the results set forth in Table 2, Polishing Compositions 2B-2E, which contained JEFFAMINE™ T-403, exhibited reduced TEOS removal rates and provided better SiN:TEOS selectivity than the control. Polishing Composition 2C, which contained 0.1 mM JEFFAMINE™ T-403, exhibited the lowest TEOS removal rate and exhibited the highest SiN:TEOS selectivity at a ratio of about 48:1.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition for polishing a silicon nitride containing substrate, the polishing composition comprising:
   an aqueous carrier;
   cationic silica particles dispersed in the aqueous carrier, the cationic silica abrasive particles having a zeta potential of at least 10 mV in the polishing composition;
   a polishing additive comprising polyether amine having a weight average molecular weight of about 500 g/mol or less, wherein the polyether amine is of Formula (I):

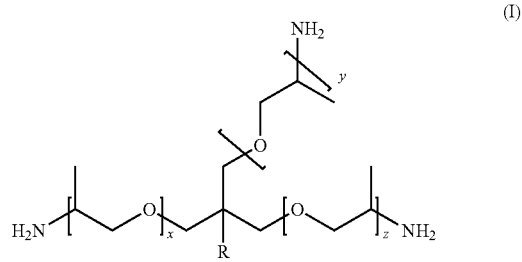

wherein R is a $C_1$-$C_6$ alkyl group and x, y, and z independently are integers from 0 to 15, wherein the polishing additive is present in the polishing composition at a concentration in a range from about 0.07 mM to about 0.25 mM; and
   wherein the polishing composition has a pH of about 6 to about 8.

2. The polishing composition of claim 1, wherein the cationic silica abrasive particles have a surface which has been treated with a quaternary aminosilane, dipodal aminosilane, or combinations thereof.

3. The polishing composition of claim 1, wherein the cationic silica abrasive particles comprise colloidal silica particles having a permanent positive charge of at least 20 mV at a pH of greater than about 6.

4. The polishing composition of claim 3, wherein the polishing composition has a pH of about 7.

5. The polishing composition of claim 1, wherein the cationic silica abrasive particles have a mean particle size of about 20 nm to about 80 nm.

* * * * *